(12) United States Patent
Dohn et al.

(10) Patent No.: US 8,545,054 B2
(45) Date of Patent: Oct. 1, 2013

(54) ARRAY OF SCALABLE CERAMIC DIODE CARRIERS WITH LEDS

(75) Inventors: Alexander Dohn, Memmelsdorf (DE); Alfred Thimm, Wunsiedel (DE); Stefan Greger, Neusorg (DE); Kurt Braun, Marktredwitz (DE); Armin Veitl, Renningen (DE)

(73) Assignee: CeramTec GmbH, Plochingen (DE)

( * ) Notice: Subject to any disclaimer, the term of this patent is extended or adjusted under 35 U.S.C. 154(b) by 0 days.

(21) Appl. No.: 13/503,974

(22) PCT Filed: Oct. 27, 2010

(86) PCT No.: PCT/EP2010/066211
§ 371 (c)(1),
(2), (4) Date: Apr. 25, 2012

(87) PCT Pub. No.: WO2011/051310
PCT Pub. Date: May 5, 2011

(65) Prior Publication Data
US 2012/0223344 A1    Sep. 6, 2012

(30) Foreign Application Priority Data

Oct. 27, 2009  (DE) .......................... 10 2009 046 049
Dec. 18, 2009  (DE) .......................... 10 2009 054 974

(51) Int. Cl.
*F21V 29/00*  (2006.01)

(52) U.S. Cl.
USPC ....................................... 362/249.02; 362/294

(58) Field of Classification Search
USPC ............................................. 362/249.02, 294
See application file for complete search history.

(56) References Cited

U.S. PATENT DOCUMENTS

| | | | |
|---|---|---|---|
| 5,857,767 A * | 1/1999 | Hochstein | 362/294 |
| 8,040,676 B2 * | 10/2011 | Kluge | 361/719 |
| 2005/0207165 A1 | 9/2005 | Shimizu et al. | |
| 2008/0151562 A1 | 6/2008 | Su et al. | |
| 2010/0089625 A1 | 4/2010 | Kluge | |

FOREIGN PATENT DOCUMENTS

| | | |
|---|---|---|
| DE | 10 2008 001221 A1 | 10/2008 |
| EP | 2 023 409 A1 | 2/2009 |
| EP | 2 056 014 A2 | 5/2009 |
| WO | WO 2007/107601 A2 | 2/2007 |

* cited by examiner

*Primary Examiner* — David V Bruce
(74) *Attorney, Agent, or Firm* — Fulbright & Jaworski LLP

(57) ABSTRACT

Ceramic diode carriers (10) comprising a ceramic carrier body (2) integrally connected to ceramic cooling elements (7) dissipating heat, wherein sintered metallization regions (41) are disposed as conductors on the surface (3) of the carrier body (2). LEDs (13) can be fastened to the diode carrier (10), the electrical connections thereof being electrically connectable to the conductors. In order to produce luminous bodies from ceramic diode carriers (10), at least two identical ceramic diode carriers (10) are connected into an array.

14 Claims, 3 Drawing Sheets

ARRAY OF SCALABLE CERAMIC DIODE CARRIERS WITH LEDS

This application is a §371 of PCT/EP2010/066211 filed Oct. 27, 2010, and claims priority from German patent Application 10 2009 046 049.7 filed Oct. 27, 2009 and from German Patent Application 10 2009 054 974.9 filed Oct. 27, 2009.

The invention relates to a ceramic diode carrier according to the preamble of claim 1.

Carriers for power LnDs can consist of ceramic materials, such as AlN or $Al_2O$, depending on the thermal conductivity that is required. Alternatively, metal carriers made from metallic materials, such as Al, can be used, yet on account of their electrical conductivity these have to be covered in a non-metallic manner before the LED assembly, or the LEDs have to be mounted on individual non-conductive built on structures (carrier plates), something which then, despite the good thermal conduction of the metallic cooling body, on account of the poor thermal conductivity of adhesives and plastics materials (typically below 3 W/mK) causes an increase in the mounting area (and cooling area) that is required or reduces the packing density of the power LEDs.

Ceramic cooling bodies 1 (see FIGS. 2a to 2d) that are also referred to as heat sinks are known from WO 2007/107501 A2. These cooling bodies 1 consist of a ceramic carrier body 2 which is provided with heat-dissipating cooling elements 7 (also referred to as fins) in one piece therewith, with sintered metallization regions 41 being applied to the surface 3 of the carrier body 2 so that the cooling body 1 can be used as a printed circuit board.

The metallization regions 41 preferably consist of tungsten and are nickel-plated chemically. FIG. 2a shows the carrier body 2 with the cooling elements 7 in a three-dimensional view, and FIG. 2b shows a plan view from below of the cooling elements 7. FIG. 2c shows a longitudinal section, and FIG. 2d shows the surface 3 of the cooling body 1.

The underlying object of the invention is to produce illumination bodies from diode carriers according to the Preamble of claim 1.

In accordance with the invention this object is achieved in that at least two identical ceramic diode carriers are connected to form an array. As a result, it is only necessary to produce identical ceramic diode carriers that are connected together physically and electrically in order to produce the illumination body to form an array. What is understood by an array is an arrangement of similar elements (here diode carriers) in a fixed fashion.

Figure 1:
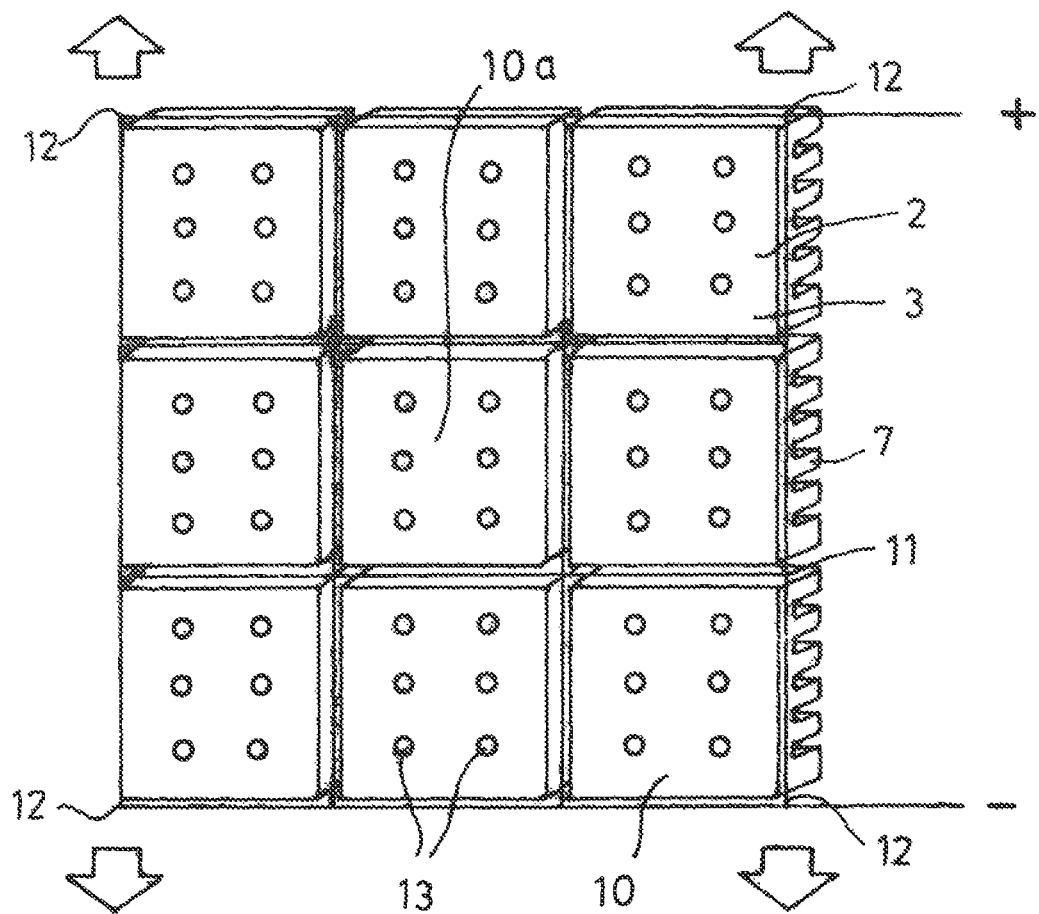
FIG. 1 shows nine identical square ceramic diode carriers with in each case a 4×4 cm circuit area, fitted in each case with six LEDs that are connected to form an array.
Figure 2A:
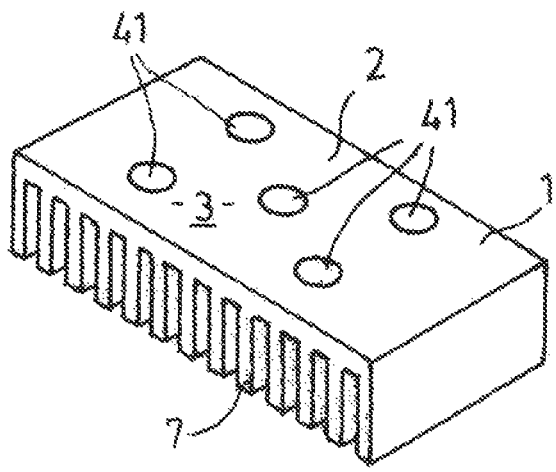
FIG. 2a shows the carrier body with the cooling elements in a three-dimensional view.
Figure 2B:
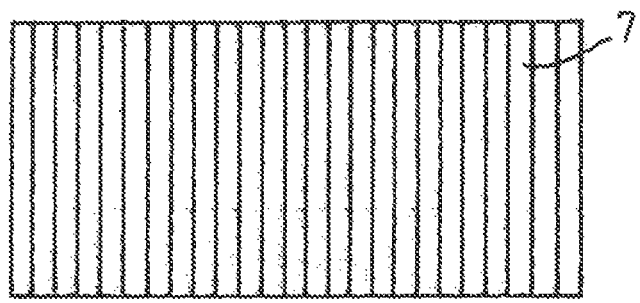
FIG. 2b shows a plan view from beneath the cooling elements.
Figure 2C:
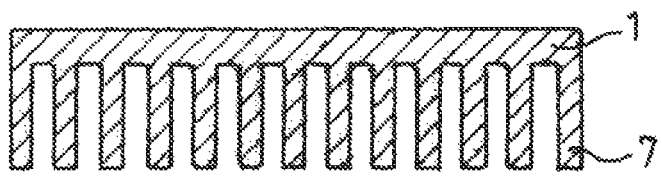
FIG. 2c shows a longitudinal section of a carrier body.
Figure 2D:
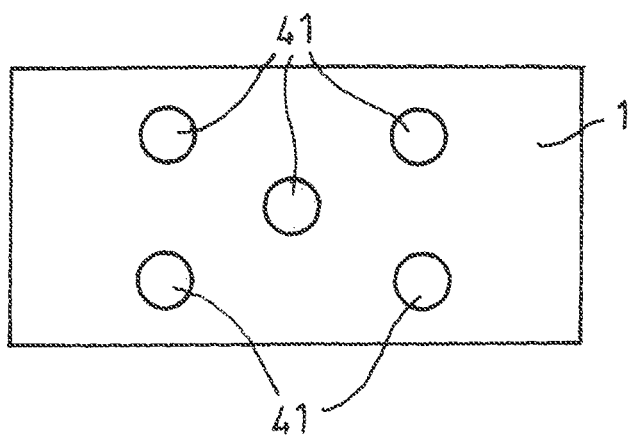
FIG. 2d shows the surface 3 of the cooling body.

In a preferred embodiment the diode carriers are inserted into a frame that is preferably made from metal or plastics material. The frame is used as a receiving device for the diode carriers. The frame can be constructed in a planar manner, yet also in a three-dimensional manner.

The diode carriers preferably have plugs and/or bushings as electrical and/or mechanical connecting elements with which adjacent diode carriers are connected together directly or indirectly. In this case, it is possible to dispense with a frame if the plugs and bushings take of this function. The plugs and/or bushings can, however, also be utilized just for the electrical connection of the diode carriers with each other. For the electrical connection, the poles of the plugs and/or bushings must be connected to the printed conductors or metallization regions.

In a preferred embodiment the plugs are pins, in particular according to the GU 5.3 standard, and the bushings are matched to the pins. In the case of this embodiment as well the pins and bushings take on both the mechanical and the electrical connection.

In an alternative preferred embodiment the diode carriers are connected together by way of separate connecting elements. These connecting elements can also be electrical and/or mechanical connecting elements, or perform both functions (mechanical and electrical connection).

In a preferred embodiment, arranged at least at one edge of the diode carriers there is a strip without metallization regions and LEDs. This strip forms a ceramic spring for securement on a frame or even a rail. At least two rails then form the frame.

The strip preferably has at least one cut-out for securement with a screw. This cut-out is preferably formed in a semi circular manner and is arranged in the centre with regard to the length of the strip. A strip that has a recess is likewise arranged on the opposite side of the diode carrier, with the cut-out being located at the same point.

In a preferred embodiment the frame is also used at the same time as a power supply for the LEDs. For this purpose the frame must consist of an electrically conductive material, for example of a metal.

In a preferred embodiment the frame is formed in a flexible manner, as a result of which a convex or concave arrangement of the diode carriers can easily be achieved. Thus, for example, the diode carriers can be mounted in a concave manner with respect to each other so that the light of the LEDs is focussed at a distance of approximately 100 cm. The array is planar for area illumination and is bent concavely on the side of the LEDs for spot illumination.

The diode carriers are in plugged, suspended or clamped in the frame, preferably in a replaceable manner, so that defective diode carriers can easily be replaced and the array is easy to produce.

In a preferred embodiment arranged on the diode carrier there are printed conductors that are parallel to each other. In each case two adjacent printed conductors establish the power supply for the LEDs.

In accordance with the invention, an array that has at least two identical ceramic diode carriers is described, wherein secured on the diode carriers there are LEDs whose electrical terminals are electrically connected to the printed conductors of the diode carriers.

Ceramic cooling bodies, formed monolithically, for example, from AlN (with 180 W/mK) as a plate with ceramic fins on the rear side, of account of the possibility of mounting the LEDs directly on the metallized cooling bodies with the aid of soldered connections with good thermal conductivity (for example AuSn with approximately 60-80 W/mK) are so efficient that a plurality of cooling bodies can also be arranged directly side by side in a scalable manner in terms of size and number to form an array. This array is held together by means of a frame, for example made from metal, with clamps for the individual cooling bodies. The diode carriers can be fixed in an array at different angles so that a focussed or a diffusing array, or an adjustable array develops. The light colours of the diodes can be different. Together with a suitable electric circuit the diodes can be switched on intermittently at certain times. The cooling bodies can be cooled by convection or cooled by liquid.

The invention is explained further in the following with the aid of figures.

FIGS. 2a to 2d show ceramic cooling bodies 1 according to WO 2007/107801 A2, as described further above.

FIG. 1 shows nine identical square ceramic diode carriers 10 with in each case a 4×4 cm circuit area, fitted in each case with six LEDs 13, each 1 watt and in the same colour, that are connected to form an array. The individual diode carriers 10 are installed or suspended in a metal frame 11 (only shown diagrammatically) that is also used at the same time as the power supply for the LEDs 13 (the power supply is not shown in this figure). At the four corners 12 the metal frame 11 or the array has been raised somewhat in contrast with the central diode carrier 10a no that the diode carriers 10 are mounted convexly in relation to each other (cannot be seen in the figure). As a consequence of the convex arrangement the light of the LEDs of the array focuses at a distance of approximately 100 cm from the diode carriers 10.

The array consisting of the diode carriers 10 is used for area illumination, yet can, as described, also be used for spot illumination. For this purpose, the diode carriers 10 are fixed at different angles in the metal frame 11 in such a way that focussed light results.

By turning up the corners 12, a parabolic arrangement with a focal light point develops, for example. The array can also be planar for area illumination or bent for spot illumination.

The diode carriers 10 consist of a ceramic carrier body 2 which is provided with heat-dissipating cooling elements 7 (also referred to as fins) in one piece therewith, with sintered metallization regions (see FIG. 2) being applied to the surface 3 of the carrier body 2 so that the carrier body 2 is used as a printed circuit board.

The metallization regions preferably consist of tungsten and are nickel-dated chemically.

Figure 3A:
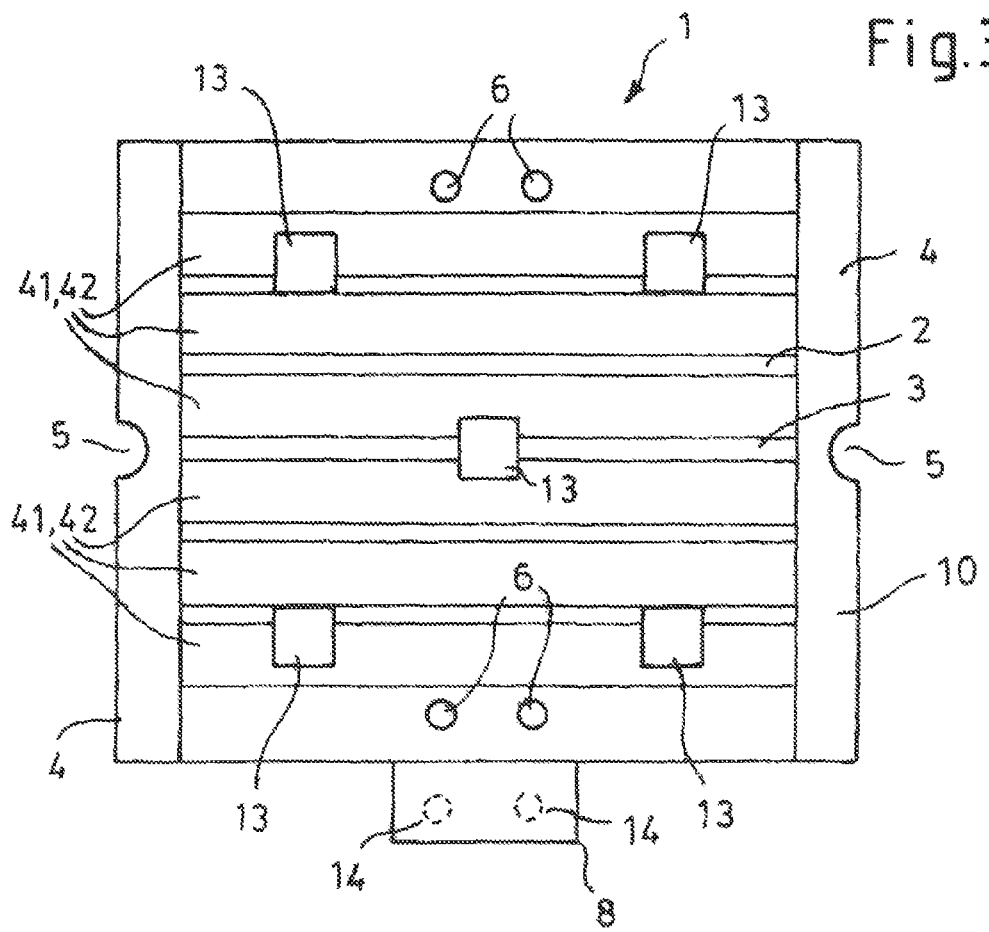
FIG. 3a is a plan view of a ceramic diode carrier in accordance with the invention.
Figure 3B:
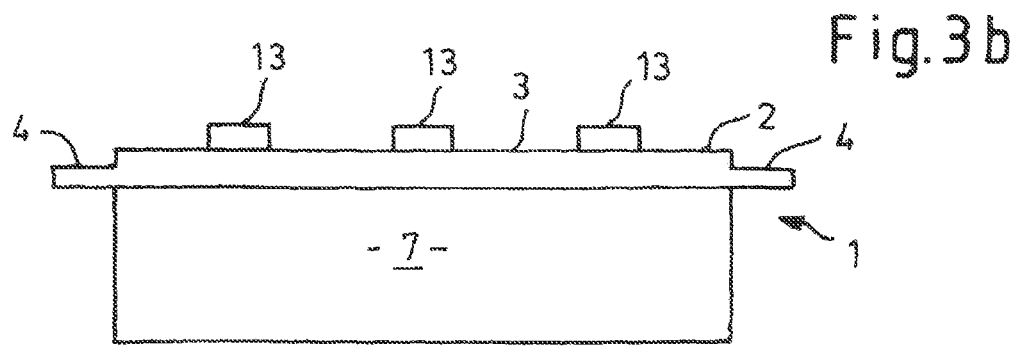
FIG. 3b is a section view of a ceramic diode carrier in accordance with the invention.

A preferred use of the array is in an operating theatre for application in surgery. Further advantageous possibilities for use are:
 street lighting
 indoor/outdoor object illumination
 floodlighting FIGS. 3a, 3b, in a plan view 3a and in section 3b, show a ceramic diode carrier 10 in accordance with the invention which consists of a cooling body 1 or of a ceramic carrier body 2 which is provided with heat-dissipating ceramic cooling elements 7, here fins, in one piece therewith. These cooling elements 7 are as shown in FIG. 2, arranged on one aide of the carrier body 2 and protrude at right angles from the carrier body 2 in a comb-like manner. Sintered metallization regions 41 are applied as printed conductors 42 to the surface 3 of the carrier body 2 so that the diode carrier 10 has the function of a printed circuit board with extremely good heat-dissipation. In this embodiment secured on the diode carrier 10 there are five LEDs 13 which are soldered onto the metallization regions 41 with their electric leads. For the current-conducting and/or mechanical connection of two or more diode carriers 10 to form an array, the diode carriers 10 have plugs and/or bushings as connecting elements with which the diode carriers are connected together directly or indirectly.

In the embodiment shown here the plugs are pins 6, in particular according to the GU 5.3 standard, and the bushings are matched to the pins. FIG. 3 shows an embodiment with exclusively plugs which consist here of pins 8. These pins 6, two for each plug, are arranged on the edge region of the diode carrier 10, with the plugs 6 being located on opposite sides of the diode carrier 10. For the connection of two diode carriers 10 a separate connecting element 8 is used here. This connecting element 8 in the variant shown here is a plate which is rectangular or square-shaped with through-bores 14. The pins 6 on the diode carrier 10 are plugged into these bores 14 establishing an electrical contact. Each connecting element 8 has four bores 14. In each case two bores 14 on the connecting element 8 are connected together electrically.

In order to secure the diode carriers 10 in a frame, at least on one edge they have a strip 4 without metallization regions 41 and without LEDs 13. This strip 4 thus forms a ceramic tongue for securement in a frame or even a rail. At least two rails then form the frame.

The strip 4 has at least one cut-out 5 for securement with preferably a screw.

The invention claimed is:

1. A ceramic diode carrier comprising:
    a ceramic carrier body which is connected to heat-dissipating ceramic cooling element in one piece therewith, wherein sintered metallization regions are arranged as printed conductors on the surface of the carrier body and there can be secured on the ceramic diode carrier light emitting diodes (LEDs) whose electrical terminals can be electrically connected to the printed conductors, wherein at least two identical ceramic diode carriers are connected to form an array.

2. A diode carrier according to claim 1, wherein the ceramic diode carrier is inserted into a frame that is preferably made from metal or plastics material.

3. A diode carrier according to claim 1, wherein the ceramic diode carrier has plugs or a bushing as an electrical or mechanical connecting elements with which adjacent diode carriers are connected together directly or indirectly.

4. A diode carrier according to claim 3, wherein the plugs are pins and the bushing is matched to the pins.

5. A diode carrier according to claim 1, wherein a plurality of ceramic diode carriers are connected together by separate connecting elements.

6. A diode carrier according to claim 1, wherein arranged at least at one edge of ceramic diode carriers there is a strip without metallization regions and LEDs.

7. A diode carrier according to claim 6, wherein the strip has at least one cut-out.

8. A diode carrier according to claim 1, wherein the frame is also a power supply for the LEDs.

9. A diode carrier according to claim 1, wherein the frame is flexible.

10. A diode carrier according to claim 1, wherein the array is planar for area illumination and is curved concavely on the side of the LEDs for spot illumination.

11. A diode carrier according to claim 1, wherein the diode carriers are installed, plugged, suspended or clamped in the frame.

12. A diode carrier according to claim 1, wherein the diode carriers are installed, plugged, suspended or clamped in the frame in a replaceable manner.

13. A diode carrier according to claim 1, wherein arranged on the diode carrier there are printed conductors that are parallel to each other.

14. An array having at least two ceramic diode carriers according to claim 1, wherein secured on the diode carriers there are LEDs whose electrical terminals are electrically connected to the printed conductors of the diode carriers.

\* \* \* \* \*